(12) United States Patent
Wang et al.

(10) Patent No.: US 10,509,929 B2
(45) Date of Patent: Dec. 17, 2019

(54) SCAN HEAD'S AIMING BEAM EXPOSURE SOLUTION SYSTEM

(71) Applicant: Shenzhen iData Technology Company Ltd., Shenzhen (CN)

(72) Inventors: Dongsheng Wang, Nancun Town (CN); Hao Chen, Shenzhen (CN); Jiangtao Wei, Shenzhen (CN); Zhenhua Deng, Chenjianzuo Town (CN)

( * ) Notice: Subject to any disclaimer, the term of this patent is extended or adjusted under 35 U.S.C. 154(b) by 0 days.

(21) Appl. No.: 15/743,233

(22) PCT Filed: Nov. 4, 2016

(86) PCT No.: PCT/CN2016/104627
§ 371 (c)(1),
(2) Date: Jan. 9, 2018

(87) PCT Pub. No.: WO2018/082020
PCT Pub. Date: May 11, 2018

(65) Prior Publication Data
US 2019/0251311 A1    Aug. 15, 2019

(51) Int. Cl.
*G06K 7/10*    (2006.01)
*G06K 7/14*    (2006.01)
*H03K 19/20*   (2006.01)

(52) U.S. Cl.
CPC ........... *G06K 7/10564* (2013.01); *G06K 7/10* (2013.01); *G06K 7/1417* (2013.01); *H03K 19/20* (2013.01)

(58) Field of Classification Search
CPC .... G06K 7/10564; G06K 7/10; G06K 7/1417; H03K 19/20
USPC ...................................... 235/462.1
See application file for complete search history.

*Primary Examiner* — Daniel A Hess
(74) *Attorney, Agent, or Firm* — Schmeiser, Olsen & Watts, LLP

(57) ABSTRACT

The invention discloses a scan head's aiming beam exposure solution system, comprising the control circuit of aiming lamp. The control circuit is composed of 5 pin terminals, wherein pin 1 and 2 are the input terminal of gate circuit, and pin 4 is the output terminal of NOT gate circuit; the high level Vcc is connected with pin 5 of the control circuit, and pin 3 of the control circuit is grounded; the pin 1 and 2 are connected with the scanning signal and the field sync signal respectively, and resistor R1 is connected with the field sync signal and is grounded. The solution system, compared with the existing scan heads on the market, can completely solve the local overexposure problem of the aiming beam, hugely improve the decoding accuracy, stability, identification rate, decoding speed and power consumption of the scan head hugely, and realize cost-effectiveness easily.

3 Claims, 2 Drawing Sheets

SCAN HEAD'S AIMING BEAM EXPOSURE SOLUTION SYSTEM

TECHNICAL FIELD OF THE INVENTION

The invention relates to the technology of two-dimensional code scan head, especially a scan head's aiming beam exposure solution system.

BACKGROUND OF THE INVENTION

As the mobile Internet and the logistics industry are flourishing, the one-dimensional code and the two-dimensional code, whichever it is in work or life, are available everywhere; therefore, a higher requirement on the scan head technology is proposed, and thence the requirements on its decoding definition, stability, low power consumption, identification rate and identification speed are becoming stricter.

In conventional two-dimensional code scan head solutions, the camera is adopted to work with the supplementary lamp and the aiming lamp; wherein the camera is used to decode, the supplementary lamp is used to provide supplementary lighting, and the aiming lamp is used to guide the operator to scan code. Typically, the supplementary lamp and the aiming lamp are required to switch on concurrently when starting the camera. However, this scan head has the following shortcomings: the aiming beam must aim at the one-dimensional code or the two-dimensional code; whereas the aiming lamp, when used as a positioning guide, has a small-area light source, and may cover the one-dimensional or two-dimensional code to be identified in most cases; therefore the partial exposure may form when the camera decodes the code; however the job of decoding code needs a clear image or picture, whereas the overexposure will greatly impact the decoding accuracy, stability, identification, decoding speed and power consumption of the scan head.

DETAILED DESCRIPTION OF THE INVENTION

It is an object of this invention to provide a scan head's aiming beam exposure solution system so as to solve the problems that were mentioned in the background of the invention aforesaid.

In order to realize the purposes aforesaid, the invention provides the following technical proposal:

A scan head's aiming beam exposure solution system, comprising the control circuit of the aiming lamp, which is composed of 5 pins, wherein pins 1 and 2 are the input terminal of the gate circuit, and pin 4 is the output terminal of the NOT gate circuit, pin 5 of the control circuit is connected with the high level Vcc, and pin 3 of the control circuit is grounded; pins 1 and 2 of the control circuit are connected with the scanning signal and the field sync signal respectively, the field sync signal is connected with the resistor R1 and is grounded thereof; pin 4 of the control circuit is connected with the grid electrode of the field effect transistor, the drain electrode of the field effect transistor is connected with the high level Vcc; the source electrode of the field effect transistor is connected with the resistor R2 and the light-emitting diode respectively, and is grounded thereof.

In a preferred embodiment, the field effect transistor is a N-type MOS tube. In a preferred embodiment, the control circuit is a U1 controller. Compared to existing technology, there are advantageous effects in the invention that include the following:

1. This scan head's aiming beam exposure solution system makes use of the camera to drive to output the field sync signal (vsync) and input the field sync signal to the control circuit, where the control circuit separates the start point and the end point of the blanking time of the field sync signal. The start point is the start signal of the aiming lamp, and the end point is the closing signal of the aiming lamp. The decoding process of the camera completes within the time of the effective picture zone of the field sync signal. The decoding time of the camera and the lightening time of the aiming lamp are completely separated to avoid overexposure caused by the aiming beam.

2. The scan head's aiming beam exposure solution system, compared to the existing scan heads on the market, can completely solve the local overexposure problem of the aiming beam, greatly improve the decoding accuracy, stability, identification rate, decoding speed and power consumption of the scan head, and realize cost-effectiveness.

EMBODIMENTS OF THE INVENTION

In line with the drawings in the embodiment of the invention, the technical proposal of the invention embodiment is described clearly and completely. Obviously, the embodiment to be described herein is only a part of the embodiments of the invention and is not the entire embodiment of the invention. Based on the embodiment of the invention, all the other embodiments that are obtained by those of ordinary skills in the art without creative labor shall be under the protection of the invention.

Figure 1:
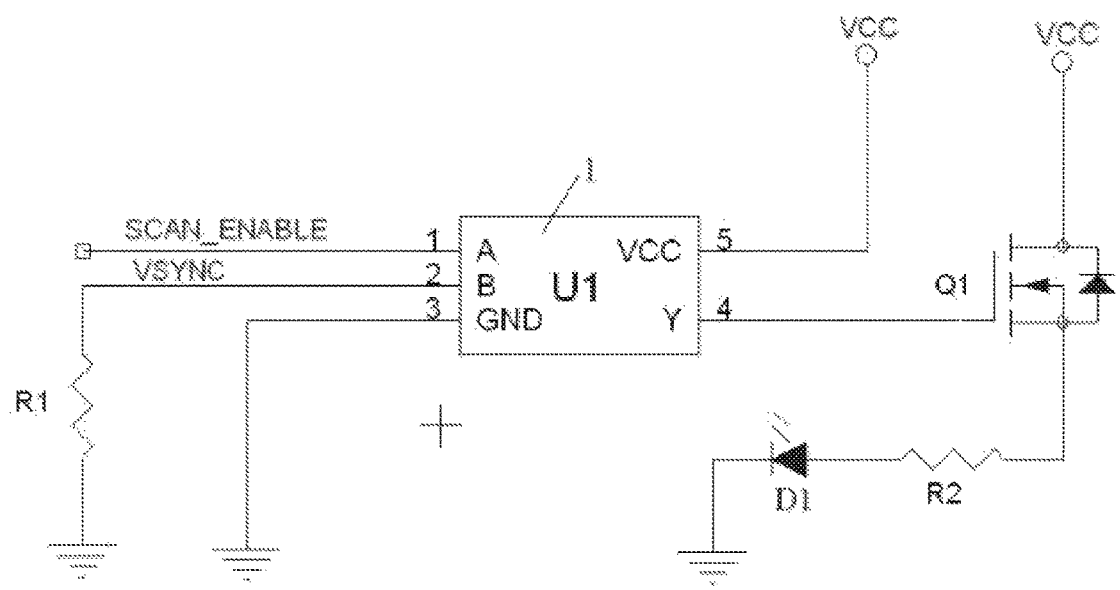
FIG. 1 Sequence Diagram of Field Sync Signal of the Invention.
Figure 2:
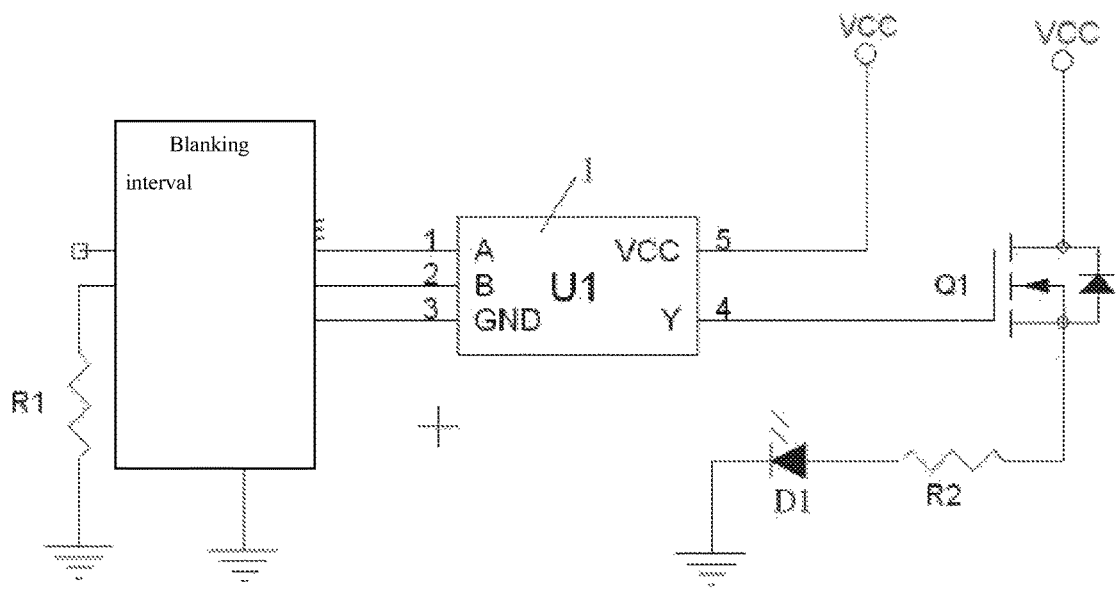
FIG. 2 Control Circuit Diagram of Aiming Lamp of the Invention wherein: 1—control circuit, Q1—field effect transistor, D1—light emitting diode, D2—diode.

According to FIG. 1-2, in the embodiment of the invention, a scan head's aiming beam exposure solution system, comprises the control circuit 1 of the aiming lamp, which is composed of 5 pins, the control circuit 1 is a U1 controller, wherein pins 1 and 2 are the input terminal of the gate circuit, and pin 4 is the output terminal of the NOT gate circuit, pin 5 of the control circuit 1 is connected with the high level Vcc, and pin 3 of the control circuit 1 is grounded; pin 1 and 2 of the control circuit 1 are connected with the scanning signal and the field sync signal respectively, the field sync signal is connected with the resistor R1 and is grounded thereof, and thereby the scan signal (SCAN_ENABLE) and the field sync signal (vsync) serve as the input terminal of the gate circuit, and the output terminal serve as the control signal of the aiming lamp; pin 4 of the control circuit 1 is connected with the grid electrode of the field effect transistor Q1, whereas the field effect transistor Q1 is a N-type MOS tube; the drain electrode of the field effect transistor Q1 is connected with the high level Vcc, and the source electrode of the field effect transistor Q1 is connected with the resistor R2 and the light-emitting diode D1 respectively, and is grounded thereof.

In conclusion, the local overexposure problem caused by the aiming beam can be solved completely. The invention makes use of the camera to drive and output the field sync signal (vsync), whereof the field sync signal is input to the control circuit 1, and the control circuit 1 separates the start point and the end point of the blanking time of the field sync signal, where the start point serves as the start signal of the aiming lamp, and the end point serves as the closing signal. The decoding process of the camera completes within the time of the effective picture zone of the field sync signal. The decoding time of the camera and the lightening time of the aiming lamp are completely separated to avoid the local overexposure caused by the aiming beam.

To those of skill in the art, the invention is not only limited to the details of the demonstrative embodiment aforesaid, moreover the invention can be realized in other special forms without deviating from the spirit or the basic characteristics of the invention herein. Therefore, for every point, the embodiment aforesaid should be deemed as demonstrative and non-restrictive. The scope of the invention is limited by the claims, instead of the aforesaid description; therefore, all changes to the meaning and scope of the equivalent element of the claims are covered by the invention. Instead, any other figures, drawings and marks in the claims should not be deemed as the ones to limit or restrict the related claims thereof.

Additionally, it is required to recognize that, the specification makes description according to the embodiment, but it is not every embodiment that contains an independent technical proposal, and the narration mode of the specification are for clarification purpose only; therefore those of skill in the art should deem the specification as an entirety; the technical proposals of every embodiment can be combined as appropriate so as to form other embodiments that are recognizable to those of skill in the art.

The invention claimed is:

1. A scan head's aiming beam exposure solution system, comprising a control circuit of an aiming lamp, the control circuit of the aiming lamp further comprising:
   a first pin coupled to a scanning signal;
   a second pin coupled to a field sync signal, wherein the field sync sign beam is coupled to a first resistor and the first resistor is grounded;
   a third pin, wherein the third pin is grounded;
   a fourth pin coupled to a grid electrode of a field effect transistor, wherein a drain electrode of the field effect transistor is coupled to a high level Vcc, and wherein a source electrode of the field effect transistor is coupled to a second resistor, the second resistor is coupled to a light-emitting diode, and the light-emitting diode is grounded; and
   a fifth pin coupled to the high level Vcc.

2. The scan head's aiming beam exposure solution system of claim 1 wherein the field effect transistor is an N-type MOS tube.

3. The scan head's aiming beam exposure solution system of claim 1, wherein the control circuit is a U1 controller.

* * * * *